United States Patent [19]

Hartwig

[11] Patent Number: 5,008,564
[45] Date of Patent: Apr. 16, 1991

[54] METHOD AND DEVICE FOR CONVERTING VOLTAGE TO FREQUENCY

[75] Inventor: Hagen Hartwig, Erlangen, Fed. Rep. of Germany

[73] Assignee: Siemens Aktiengesellschaft, Munich and Berlin, Fed. Rep. of Germany

[21] Appl. No.: 494,600

[22] Filed: Mar. 16, 1990

[30] Foreign Application Priority Data

Mar. 17, 1989 [DE] Fed. Rep. of Germany ....... 3908848

[51] Int. Cl.$^5$ .......................... H03L 7/00; H03M 1/60
[52] U.S. Cl. .................................... 307/271; 331/1 R; 341/157
[58] Field of Search ................. 307/271; 331/1 R, 34, 331/17; 328/15, 140, 14; 341/110, 157

[56] References Cited

U.S. PATENT DOCUMENTS

| | | | |
|---|---|---|---|
| 3,094,629 | 6/1963 | Ostroff et al. | 307/88.5 |
| 3,260,943 | 7/1966 | Huelsman et al. | 328/69 |
| 3,327,229 | 6/1967 | Huelsman | 328/150 |
| 3,952,253 | 4/1976 | Devolpi et al. | 328/140 |
| 3,965,430 | 6/1976 | Brandt | 328/140 |
| 4,309,909 | 1/1982 | Grebe, Jr. et al. | 73/861 |
| 4,651,104 | 3/1987 | Miyo | 307/271 |
| 4,724,419 | 2/1988 | Kreuzer | 341/157 |
| 4,839,603 | 6/1989 | Mower et al. | 328/14 |
| 4,868,573 | 9/1989 | Wittmer | 341/157 |
| 4,926,174 | 5/1990 | Fiori, Jr. | 341/110 |
| 4,943,779 | 7/1990 | Pedersen et al. | 328/14 |
| 4,943,786 | 7/1990 | Cordwell et al. | 331/17 |

FOREIGN PATENT DOCUMENTS 3037174 4/1981 Fed. Rep. of Germany .

Primary Examiner—Stanley D. Miller
Assistant Examiner—Toan Tran
Attorney, Agent, or Firm—Kenyon & Kenyon

[57] ABSTRACT

A method for converting voltage to frequency and a device for implementing the method where an extremely rapid and highly accurate digitization of an input signal at a great freqency deviation is achieved using simple means. An input voltage which is raised into the positive range, is integrated, and as an integrated voltage is compared with a reference voltage which is variable in constant voltage steps. The resulting differential voltage acts upon a voltage controlled oscillator through a control element. The voltage controlled oscillator emits a pulse repetition frequency which is proportional to the output voltage of the controlling element. The reference voltage is incremented with each pulse so that this voltage follows the integrated voltage in a step-like manner. The pulse repetition frequency of the pulses, which are generated by the voltage controlled oscillator, is therefore proportional to the input voltage.

6 Claims, 2 Drawing Sheets

METHOD AND DEVICE FOR CONVERTING VOLTAGE TO FREQUENCY

FIELD OF THE INVENTION

This invention relates to a method and a device for converting voltage to frequency.

BACKGROUND OF THE INVENTION

In data acquisition, a voltage/frequency converter can often replace an analog/digital or digital/analog converter. A voltage/frequency converter emits as an output a frequency signal which is proportional to the input voltage instead of a binary parallel code word. The analog part of a circuit can be easily isolated from the digital part. Therefore, voltage/frequency converters are used in various areas of electrical and electronic engineering. For example, when controlling electric motors, the actual current or voltage values can be easily integrated into a digital control system by converting the actual current or voltage values into a proportional sequence of pulses.

For integrating the detection of the actual voltage or current value into a digital control system, it is desirable to convert the continuous signal at the location of its detection into a proportional frequency signal and to transmit it in the form of pulses with a variable pulse repetition frequency. In this manner, a high interference immunity is guaranteed, since only small demands are made on the pulse shape in further processing of the pulses.

An economical, and therefore, a very quick and highly accurate digitization of a continuous input signal having great frequency deviation cannot be realized solely by conventional voltage/frequency converters. Thus, there is a need for a method and a device which realizes a quick, highly accurate voltage/frequency conversion having a large frequency deviation using simple means.

SUMMARY OF THE INVENTION

This and other needs are satisfied by the method and device of the present invention for converting voltage to frequency. In accordance with the present invention, an input voltage, which can have an arbitrary value with respect to time, is increased into the positive range by adding a constant voltage. The raised input voltage is integrated and compared to a reference voltage which varies in constant voltage steps. A voltage controlled oscillator generates a sequence of pulses which are proportional to the output voltage of the controlling element. The voltage differential between the integrated voltage and the reference voltage acts upon the voltage controlled oscillator via a controlling element. The reference voltage increases by one constant voltage step with each output pulse of the voltage oscillator so that the voltage differential between the integrated voltage and the reference voltage approaches zero. Upon reaching a specified upper limiting value, the above process is repeated, where the integration of the raised input voltage is reversed and the reference voltage is decreased by one constant voltage step. Upon reaching a specified lower limiting value, the aforementioned process starts over with normal integration of the raised input voltage and increasing the reference voltage by one constant voltage step every time a pulse is output by the voltage oscillator. The pulses generated by the voltage controlled oscillator are counted within one time interval.

In a further development of the invention, a d.c. voltage is formed from the generated pulses. Next, a differential voltage is formed from this d.c. voltage and the raised input voltage. Then, a control voltage is generated from the sum of this differential voltage and the raised input voltage. The control voltage acts upon a respectively applied integrating device.

This development of the invention serves to control errors and can be applied when high demands are placed on the accuracy of the voltage/frequency conversion. Also, for reasons of cost, this development allows the use of less efficient and less accurate components.

A device for implementing the aforementioned method comprises an amplifier with a variable positive and negative amplification which is triggerable by a changeover signal. The output of the amplifier is coupled to the input of an integrator. The first input of a comparator is coupled to the output of the integrator and the second input of the comparator is coupled to the analog output of a digital/analog converter. The output of the comparator is coupled to the input of a controller. A voltage controlled oscillator is located downstream from the controller. The voltage controlled oscillator generates a pulse whose pulse repetition frequency is a function of its input signal. Evaluating logic, which is coupled to the output of the voltage controlled oscillator, counts the pulses in a specific time interval. The sum of the pulses per time interval can be picked off at the output of the evaluating logic. A counter, which has a changeable counting direction, has its counting pulse input coupled to the output of the voltage controlled oscillator. The output of the counter is coupled to the digital input of the digital/analog converter. The counter outputs an overshoot signal through an overshoot output whenever the counter reaches a specifiable upper or lower counting limit. A bistable switch emits a changeover signal with each overshoot signal output by the counter. The changeover signal from the bistable switch causes the changeover between the positive and negative amplification of the amplifier and the changeover of the counting direction of the counter via its changeover input.

In a further development of the present invention, the voltage controlled oscillator generates pulses which are reconverted into a d.c. voltage by a control system. A device is provided comprising a monostable precision switch which is controlled by an oscillator. The monostable precision switch generates a precision pulse with a constant pulse width with each pulse it receives from the oscillator. A switch passes incoming precision pulses from the monostable precision switch onto a low pass filter as precision pulses with a constant surface area. A comparator forms a differential voltage from the d.c. voltage at the output of the low pass filter and the raised input voltage. A controller controls the differential voltage. A comparator, located between the output of the amplifier and the residual control system of the voltage/frequency converter, forms a controlled variable for the residual control system of the voltage/frequency converter from the sum of the amplified raised input voltage at the output of the amplifier and the controlled differential voltage at the output of the controller. The evaluating logic may be coupled to the remaining device through a transmission link and a driver stage.

DETAILED DESCRIPTION

Figure 1:
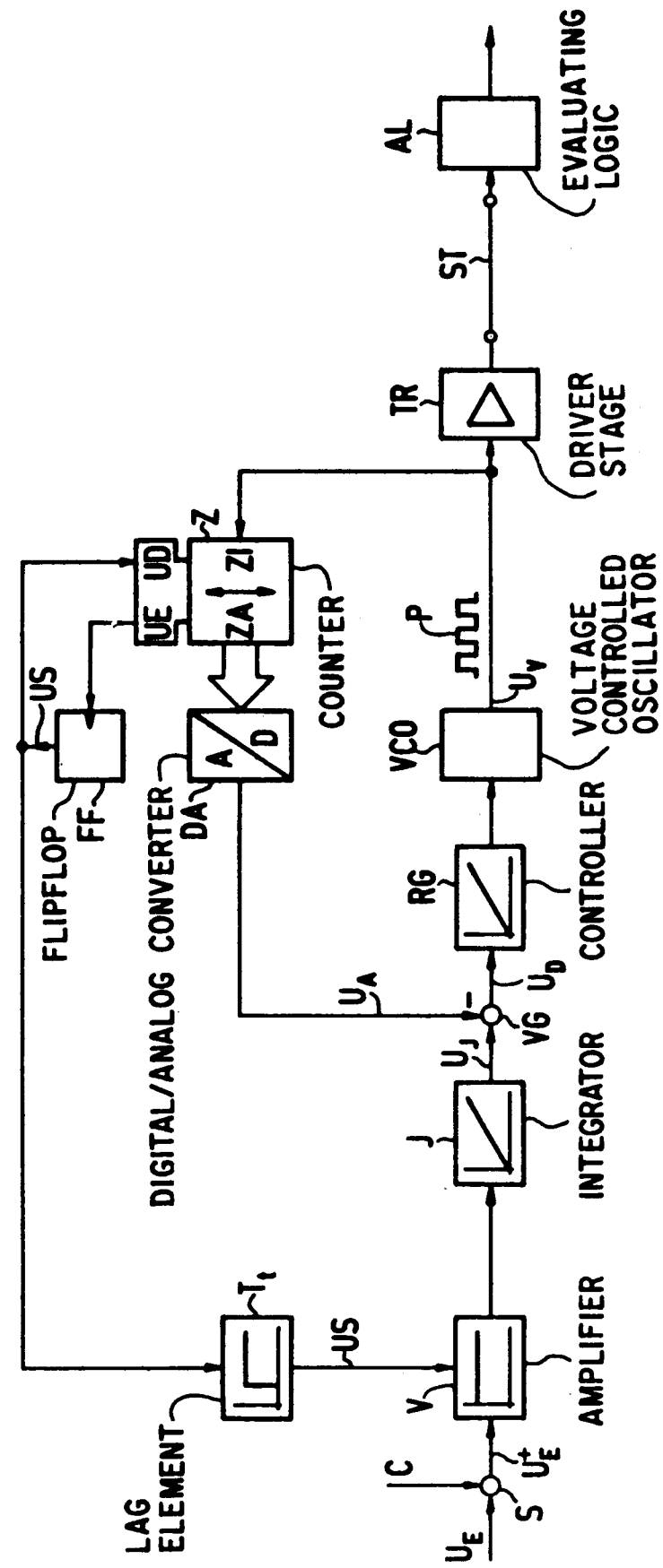
FIG. 1 is a block diagram of a device for converting voltage to frequency constructed according to the invention.

Referring to FIG. 1, a device for converting voltage to frequency is shown. The direction of the signal flow is indicated in the block diagram by arrows. In this manner, the respective inputs and outputs of each block are indicated. The device comprises a summing unit S, an amplifier V, an integrator J, a comparator VG, a controller RG, a voltage controlled oscillator VCO, a driver sage TR, a transmission link ST, and evaluating logic AL.

The summing unit S is provided having two inputs. The first input of the summing unit S is acted upon by an input voltage $U_E$ and the second input is acted upon by a constant C. The constant C is calculated so that the input voltage $U_E$ is increased into the positive range $U_E+$. The constant C, however, could also be calculated so that the input voltage $U_E$ is transformed into the negative range. In the transformation of the input voltage $U_E$, it is important that no polarity reversal takes place as it varies with respect to time.

The raised input voltage $U_E+$ acts upon the amplifier input of the amplifier V. The amplifier V has a second input for a changeover signal US. The amplifier can be switched to positive or negative amplification through this second input by the changeover signal US.

The comparator VG and the controller RG are shown separately for clarity however. The comparator VG can also be an integral component of the controller RG. In this case the controller RG would have two inputs.

The output of the voltage controlled oscillator VCO is coupled to the input ZI of a counter Z. In this embodiment, the counter Z is indicated as an up/down counter by a double arrow. The output ZA of the counter Z is coupled to the digital input D of a digital-/analog converter DA, whose analog output A is coupled to the second input of the comparator VG.

In addition to the counting pulse input ZI and the counter output ZA, the counter Z also has a counting direction changeover input UD and an overshoot signal output UE. A signal can be output over the overshoot signal output UE whenever the counter Z has reached a specifiable counting limit. This overshoot signal UE is transmitted to the input of a bistable switching device FF (flipflop). The changeover signal US appears at the output of the bistable switching device as, for example, a binary signal.

If an arbitrary, even bipolar, input voltage $U_E$ is applied to the first input of the summing unit S, then this input voltage $U_E$ is increased into the positive range by adding the input voltage $U_E$ to the predetermined constant C. The raised input voltage $U_E+$ is applied to the input of the integrator J. It is assumed that the raised input voltage $U_E+$ is proportional to the actual current value of a servomotor. This voltage should be used for controlling the servomotor. Since the average value of the raised input voltage $U_E+$ is of interest for controlling purposes, this raised input voltage $U_E+$ is first integrated and is then transmitted as an integrated voltage $U_J$ to the first input of the comparator VG. Simultaneously, a reference voltage $U_A$ is applied to the second input of the comparator VG and compared with the integrated voltage $U_J$.

At time $t=0$, the reference voltage $U_A$ and the integrated voltage $U_J$ are equal to zero. Due to the applied input voltage $U_E$, the integrated voltage $U_J$ increases to a point greater than 0 at the time t.

In this manner, a differential voltage $U_D$, which corresponds to the difference of the reference voltage $U_A$ and the integrated voltage $U_J$, appears at the output of the comparator VG, such that:

$$U_D = U_J - U_A.$$

The differential voltage $U_D$ is positive when the integrated voltage $U_J$ is greater than the reference voltage $U_A$ and negative when the integrated voltage $U_J$ is less than the reference voltage $U_A$. In this manner, a positive or negative output signal appears at the output of the controller RG. The differential voltage $U_D$ acts upon the voltage controlled oscillator VCO.

The controller RG is designed as a rapid integrator because no lasting control system deviations appear and the lag times of the system are controllable. The larger the control system deviation $U_D$, in the case of I-controllers the quicker the I-controller will integrate in the corresponding direction. If $U_D=0$, then the control output retains its last value.

A simpler controller (e.g. a P-controller) can be used when the demands for the quality of the control system are low. For higher quality demands, a PI-controller or a controlling element of a higher accuracy could also be used.

The voltage controlled oscillator VCO generates an output signal $U_V$ in the form of a pulse interval signal P. The pulse interval signal P has a pulse repetition frequency proportional to the output of the controller RG.

The output signal $U_V$ of the voltage controlled oscillator VCO is input to the counting pulse input ZI of the counter Z and the drive circuit TR. With each pulse P, the counter Z is step-enabled by one counter step, and the reference voltage $U_A$ is increased by one voltage step at the output A of the digital/analog converter DA. By increasing the reference voltage $U_A$, it becomes greater than the integrated voltage $U_J$.

The greater the differential voltage $U_D$, the faster the controller raises the pulse repetition frequency of the voltage controlled oscillator VCO. A rapid increase in the pulse repetition frequency causes the counter Z and the digital/analog converter DA to increase rapidly in specified, constant steps. The rapid increase in the counter causes the reference voltage to rapidly increase and thus the integrated voltage "catches up" again. Thus, the pulse repetition frequency of the voltage controlled oscillator is proportional to the input voltage $U_E$.

In the example of FIG. 1, the pulses P are transmitted over a driver stage TR and a transmission link ST to evaluating logic AL. High demands are not placed on the transmission link ST during the transmission of pulses P. The transmission of a high pulse repetition frequency (e.g. 20 MHz) is not problematic. Only small demands are placed on the pulse shape so that the quality of the method of the present invention is not impaired as long as the pulses P are able to be identified by the evaluating logic AL. When a pulse cannot be identified, no lasting error results because the accuracy of a count is influenced only within the specified time interval. In this respect, the method of the present invention has a high immunity to interference.

The pulse repetition frequency of the voltage/frequency converter can be easily evaluated by totaling the number of pulses in a counter (e.g. 16 bit counter) and integrating the total in the evaluating logic AL. This counter can be a component of a digital control device so that the result of the voltage/frequency conversion can immediately be retrieved for controlling purposes. The subsequent processing of the pulse repetition frequency can vary freely with respect to the selection of the sampling times and the various types of averaging. The averaging could take place using a so-called sliding window. By using a sliding window the number of pulses within a time interval T is counted, and the count is periodically repeated within a shorter time interval than the time interval T.

In the present description of the voltage/frequency conversion, the ideal assumption was made that the integrator J, the counter Z, and the digital/analog converter DA do not have upper limiting values. In actual components, this is naturally not the case. Therefore, measures must be taken which guarantee the operation of the method even when the integrator J, the counter Z, or the digital/analog converter DA reach their upper or lower limit.

The upper limiting value of the counter Z should be designed so that its upper limit will be reached before the integrator J has reached its upper physical integration limit. Obviously, the digital/analog converter DA should also be designed so that it operates correctly for the entire specified counting range of the counter Z.

The integration of the raised input voltage $U_{E+}$ and the step-enabling of the reference voltage $U_A$ by the counter Z and the digital/analog converter DA takes place until the counter Z has reached its specified upper limit. Upon reaching this upper limit, an overshoot signal is transmitted to the bistable switch FF over the overshoot output UE of the counter Z. The bistable switch FF subsequently changes the binary condition of its output. This change of the binary condition immediately arrives as a changeover signal at the changeover input UD of the counter Z. The counter changeover in the counter Z is brought about in this manner. The counter will count down in constant steps starting from its upper limiting value with the next counting pulse. The integrational direction of the integrator does not change at this time since the changeover signal arrives with a time delay over a lag element $T_t$ at the amplifier V. The lag time of the digital/analog converter is compensated by the lag element $T_t$. The amplifier changes over only when the output of the digital/analog converter, which is conditioned by the directional change of the counter, has also changed direction. The lag time $T_t$ can be specified so that it corresponds to the lag time of the type of converter being used.

After the specified lag time has passed, the amplification of the amplifier V is changed over by the changeover signal US (i.e., the amplifier now operates with a negative amplification). The integrational direction of the integrator J also reverses.

When the counter has again reached its lower limit, the bistable switch FF is again triggered VIG the changeover output UE of the counter Z. The binary signal of the bistable switch FF changes its output and the changeover signal US. The changeover signal US reverses the counting direction of the counter Z in order to switch the amplifier V again to a positive amplification. The process then starts from the beginning.

Figure 2:
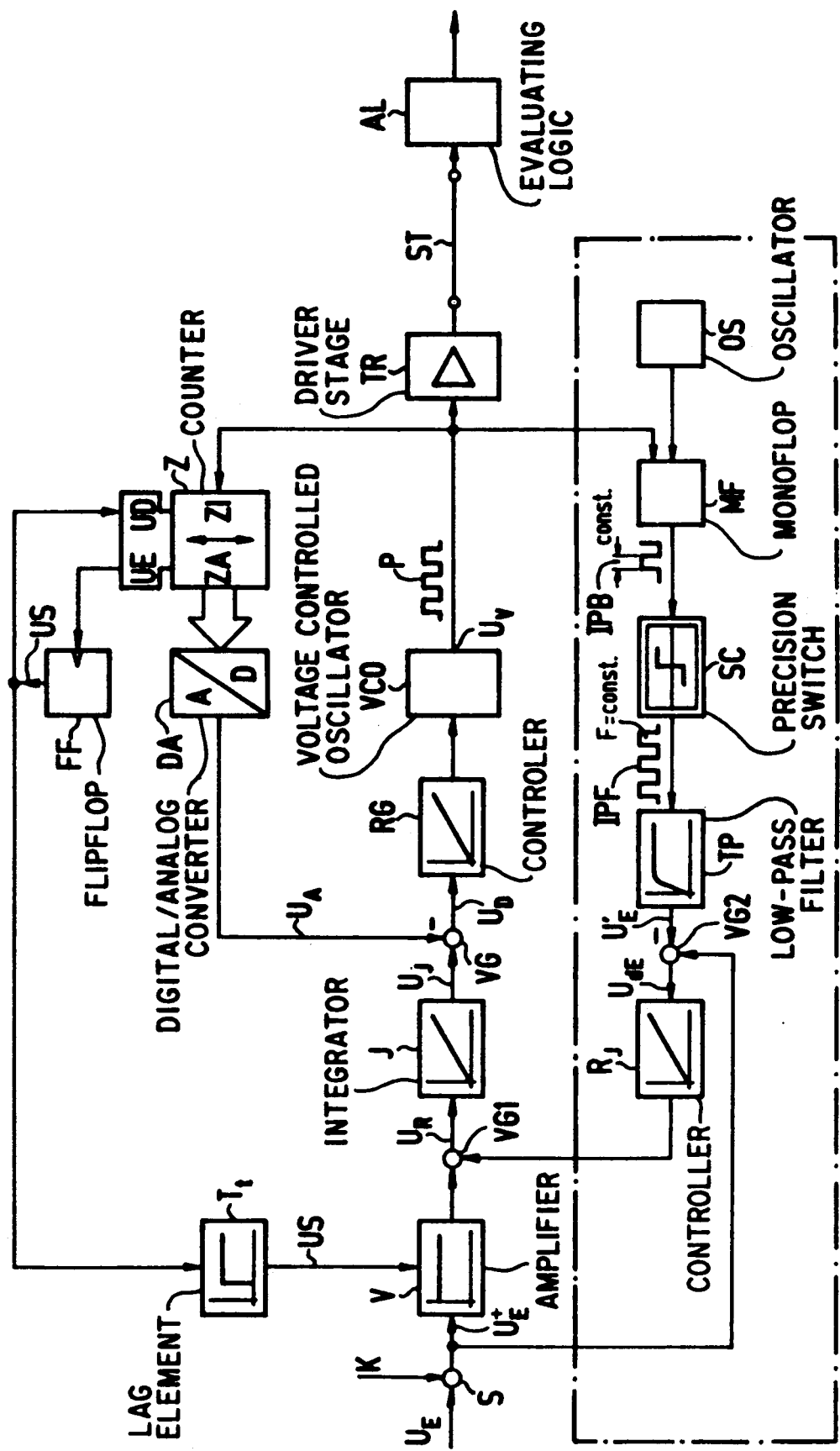
FIG. 2 is a block diagram of a device for converting voltage to frequency having an error control system constructed according to the invention.

The operational reliability of the voltage/frequency converter, which is influenced by the quality of the components, can be further improved by an error controls system as described in reference to FIG. 2.

Referring to FIG. 2, a block diagram of a device for converting voltage to frequency having an error control system is shown. The controlled system for controlling errors is set off by a dashed rectangle. Except for a comparator VG1 located between the amplifier V and the integrator J, the remaining portion of the block diagram corresponds to the block diagram shown in FIG. 1.

The controlled system for controlling errors comprises an oscillator OS, a monostable switch MF (monoflop), a precision switch SC, a low-pass filter TP, a second comparator VG2, and a controller $R_J$. The combination of the oscillator OS and the monoflop MF forms a so-called precision-type monoflop.

The pulses P, which are generated by the voltage controlled oscillator VCO, arrive at the input of the monoflop MF. With each of the incoming pulses P, the monoflop MF picks off precisely one cycle of the oscillator OS and generates a precision pulse IPB which has a respectively constant pulse width. These precision pulses IPB are transmitted to the input of the precision switch SC. The precision switch SC transmits to its output the incoming precision pulses IPB with a precisely defined voltage amplitude. The monoflop MF, the oscillator OS, and the precision switch SC together generate a precision pulse IPF having a precisely defined, constant surface area. This precision pulse IPF is transmitted to the input of the low-pass filter TP which outputs a d.c. voltage $U_E'$, which is proportional to the pulse repetition frequency. In an ideal voltage/frequency conversion, the d.c. voltage $U_E'$ would have to be equal to the raised input voltage $U_{E+}$. This d.c. voltage $U_E$, is compared with the raised input voltage $U_E$ at the comparator VG2 and the resulting differential voltage $U_{dE}$ is fed to the controlled system at the comparator VG1 through a controller $R_J$. A control voltage $U_R$ is formed at the output of the comparator VG1 from the difference of the differential voltage $U_{dE}$ and the raised and amplified input voltage $U_{E+}$.

With this error control system, the method or the device still operates with sufficient accuracy even when components of lesser quality are used.

What is claimed is:

1. A method of converting voltage to frequency comprising:
   (a) increasing an input voltage having an arbitrary value with respect to time, into the positive range by adding a constant voltage;
   (b) integrating the raised input voltage;
   (c) comparing said integrated raised input voltage with a reference voltage which varies in constant voltage steps;
   (d) acting upon a voltage controlled oscillator which generates a sequence of pulses which are proportional to the output voltage of a controlling element, with the voltage differential between the integrated voltage and the reference voltage via the controlling element;
   (e) increasing the reference voltage by one constant voltage step with each pulse so that the voltage differential approaches zero;

(f) repeating steps (a) to (e) until reaching a specified upper limiting value;

(g) upon reaching said limiting value, reversing the integration of the raised input voltage and lowering the reference voltage by one constant voltage step;

(h) repeating steps a) to e) until reaching a specified lower limiting value;

(i) and upon reaching said limiting value, reversing the integration of the raised input voltage, increasing the reference voltage by one constant voltage step;

counting the pulses generated by the voltage controlled oscillator within a predetermined time interval.

2. The method of claim 1, further comprising:

forming a d.c. voltage from the generated pulses;

forming a differential voltage from the d.c. voltage and the raised input voltage;

generating a control voltage from the sum of the differential voltage and the raised input voltage;

acting upon a respectively applied integrating device with said control voltage.

3. A device for converting voltage to frequency comprising:

an amplifier with a positive and negative amplification controllable in response to a changeover signal;

an integrator having as an input the output of the amplifier;

a digital/analog converter;

a comparator with at least two inputs, a first input coupled to the output of the integrator, and a second input coupled to the analog output of said digital/analog converter;

a controller having as an input the output of the comparator;

a voltage controlled oscillator located downstream from the controller and which generates pulses, where the pulse repetition frequency is a function of its input signal;

evaluating logic coupled to the output of the voltage controlled oscillator counting the pulses in a specific time interval, whereby the sum of the pulses per time interval can be picked off at the output of the evaluating logic for further processing;

a counter which has a changeable counting direction, having a counting pulse input coupled to the output of the voltage controlled oscillator and an output coupled to the digital input of the digital-/analog converter, and an overshot output at which the counter outputs an overshoot signal whenever a respective specifiable upper or lower counting limit is reached; and a bistable switch emitting a changeover signal with each overshoot signal of the counter, said changeover signal bringing about the changeover between the positive and negative amplification of the amplifier and the changeover of the counting direction of the counter by means of its changeover input.

4. The device of claim 3, further comprising:

a control system reconverting pulses generated by the voltage controlled oscillator into a d.c. voltage:

an oscillator;

a monostable precision switch controlled by said oscillator and generating a precision output pulse with a constant pulse width at each input pulse;

a low-pass filter;

a switch coupling the incoming precision pulses having a constant amplitude from the monostable precision switch to the low-pass filter;

a second comparator having as inputs the d.c. voltage at output of the low-pass filter and the raised input voltage, and forming therefrom a differential voltage;

a controller having the differential voltage as an input; and a third comparator coupled between the output of the amplifier and the remaining control system of the voltage/frequency converter, having the output of said controller as an input and forming a controlled variable for the remaining control system of the voltage/frequency converter from the sum of the amplified, raised input voltage at the output of the amplifier and from the controlled differential voltage at the output of the controller thereby forming a controlled system for the voltage/frequency converter.

5. The device of claim 3 and further including a transmission link and a driver stage coupling evaluating logic to a using device.

6. The device of claim 4 and further including a transmission link and a driver stage coupling evaluating logic to a using device.

* * * * *